US012586750B2

(12) United States Patent
Saito

(10) Patent No.: US 12,586,750 B2
(45) Date of Patent: Mar. 24, 2026

(54) CHARGED PARTICLE BEAM SYSTEM AND CONTROL METHOD THEREFOR

(71) Applicant: JEOL Ltd., Tokyo (JP)

(72) Inventor: Takamitsu Saito, Tokyo (JP)

(73) Assignee: JEOL Ltd., Tokyo (JP)

( * ) Notice: Subject to any disclaimer, the term of this patent is extended or adjusted under 35 U.S.C. 154(b) by 386 days.

(21) Appl. No.: 18/137,153

(22) Filed: Apr. 20, 2023

(65) Prior Publication Data

US 2023/0343550 A1 Oct. 26, 2023

(30) Foreign Application Priority Data

Apr. 21, 2022 (JP) ................................ 2022-070101

(51) Int. Cl.
*H01J 37/147* (2006.01)
*H01J 37/26* (2006.01)
*H01J 37/28* (2006.01)

(52) U.S. Cl.
CPC ...... *H01J 37/1474* (2013.01); *H01J 37/1475* (2013.01); *H01J 37/1477* (2013.01); *H01J 37/265* (2013.01); *H01J 37/28* (2013.01); *H01J 2237/1504* (2013.01); *H01J 2237/1508* (2013.01); *H01J 2237/2802* (2013.01)

(58) Field of Classification Search
None
See application file for complete search history.

(56) References Cited

U.S. PATENT DOCUMENTS

| 7,075,078 B2 * | 7/2006 | Ose | H01J 37/28 |
| | | | 250/311 |
| 9,978,562 B2 * | 5/2018 | Van De Peut | H01J 37/045 |
| 2015/0041643 A1 * | 2/2015 | Li | H01J 37/1471 |
| | | | 250/307 |
| 2020/0266025 A1 | 8/2020 | Morishita et al. | |

FOREIGN PATENT DOCUMENTS

JP 2020123533 A 8/2020

* cited by examiner

*Primary Examiner* — Eliza W Osenbaugh-Stewart
(74) *Attorney, Agent, or Firm* — The Webb Law Firm

(57) ABSTRACT

Provided is a charged particle beam system capable of scanning a sample in a short time. The charged particle beam system is operative to scan the sample with a charged particle beam and to obtain a scanned image, and includes a magnetic deflector for producing a magnetic field to deflect the beam, an electrostatic deflector for producing an electric field to deflect the beam, and a controller for controlling both magnetic deflector and electrostatic deflector. The controller causes the magnetic deflector to deflect the beam in a first direction and to draw a first scan line, causes the magnetic deflector to deflect the beam in a second direction perpendicular to the first direction, causes the electrostatic deflector to deflect the beam in a third direction opposite to the first direction, and causes the magnetic deflector to deflect the beam in the first direction and to draw a second scan line.

10 Claims, 10 Drawing Sheets

CHARGED PARTICLE BEAM SYSTEM AND CONTROL METHOD THEREFOR

CROSS REFERENCE TO RELATED APPLICATION

This application claims priority to Japanese Patent Application No. 2022-070101, filed Apr. 21, 2022, the disclosure of which is hereby incorporated by reference in its entirety.

BACKGROUND OF THE INVENTION

1. Field of the Invention

The present invention relates to a charged particle beam system and a method for controlling the same.

2. Description of the Related Art

Charged particle beam systems such as scanning transmission electron microscopes (STEMs) and scanning electron microscopes (SEMs) are known as instruments for focusing an electron beam into an electron probe, scanning a sample with the electron probe, and obtaining scanned images.

For example, JP-A-2020-123533 discloses a scanning transmission electron microscope (STEM) capable of producing an STEM image by forming an electron probe from a focused electron beam, scanning a sample with the electron probe, and detecting either electrons transmitted through the sample or electrons scattered by the sample in synchronism with the scanning with the electron probe. In the technique of JP-A-2020-123533, scanning of the electron probe is performed using scan coils which produce a magnetic field to deflect the electron beam.

Scanning of an electron beam is carried out by drawing a horizontal scan line with an electron beam, deflecting back the beam, and drawing a next scan line. The scan coils cause ringing due to their transient response and exhibit a nonlinear response. This makes it necessary to introduce a wait time from when the beam is deflected back until a next scan line is drawn. This wait time is also referred to as the flyback time. In a scanning transmission electron microscope, the flyback time is set longer than the nonlinear response time of the scan coils. An STEM image is acquired after the end of the linear response of the scan coils. Consequently, distortion and blur of the STEM image can be reduced.

In this way, in a charged particle beam system where the charged particle beam is deflected by a magnetic field, the flyback time must be reset whenever the charged particle beam is deflected back.

SUMMARY OF THE INVENTION

One aspect of the charged particle beam system associated with the present invention is a charged particle beam system which is designed to scan a sample with a charged particle beam and to obtain a scanned image and which includes: a magnetic deflector for producing a magnetic field to deflect the charged particle beam; an electrostatic deflector for producing an electric field to deflect the charged particle beam; and a controller for controlling the magnetic deflector and the electrostatic deflector. The controller (i) causes the magnetic deflector to deflect the charged particle beam in a first direction and to draw a first scan line, (ii) causes the magnetic deflector to deflect the charged particle beam in a second direction perpendicular to the first direction, (iii) causes the electrostatic deflector to deflect the charged particle beam in a third direction opposite to the first direction, and (iv) causes the magnetic deflector to deflect the charged particle beam in the first direction and to draw a second scan line.

In this charged particle beam system, after the first scan line is drawn by the magnetic deflector, the charged particle beam is deflected back by the electrostatic deflector and the second scan line is drawn by the magnetic deflector. Therefore, the flyback time can be shortened as compared with the case where a charged particle beam is deflected back by a magnetic deflector. Consequently, in this charged particle beam system, a sample can be scanned in a short time.

One aspect of the control method associated with the present invention is for use in a charged particle beam system including both a magnetic deflector for producing a magnetic field to deflect a charged particle beam and an electrostatic deflector for producing an electric field to deflect the charged particle beam, the charged particle beam system operating to scan a sample with the charged particle beam and to obtain a scanned image. The control method comprises the steps of: causing the magnetic deflector to deflect the charged particle beam in a first direction and to draw a first scan line; causing the magnetic deflector to deflect the charged particle beam in a second direction perpendicular to the first direction; causing the electrostatic deflector to deflect the charged particle beam in a third direction opposite to the first direction; and causing the magnetic deflector to deflect the charged particle beam in the first direction and to draw a second scan line.

With this control method for the charged particle beam system, after drawing the first scan line by the magnetic deflector, the charged particle beam is deflected back by the electrostatic deflector and the second scan line is drawn by the magnetic deflector. Therefore, the flyback time can be shortened as compared with the case where the charged particle beam is deflected back by the magnetic deflector. Consequently, with this control method for the charged particle beam system, a sample can be scanned in a short time.

DESCRIPTION OF THE INVENTION

Non-limiting embodiments of the present invention are hereinafter described in detail with reference to the accompanying drawings. It is to be understood that the embodiments provided below are not intended to unduly restrict the contents of the present invention delineated by the claims and that not all the configurations set forth below are the essential constituent components of the invention.

1. Electron Microscope

1.1. Configuration of Electron Microscope

Figure 1:
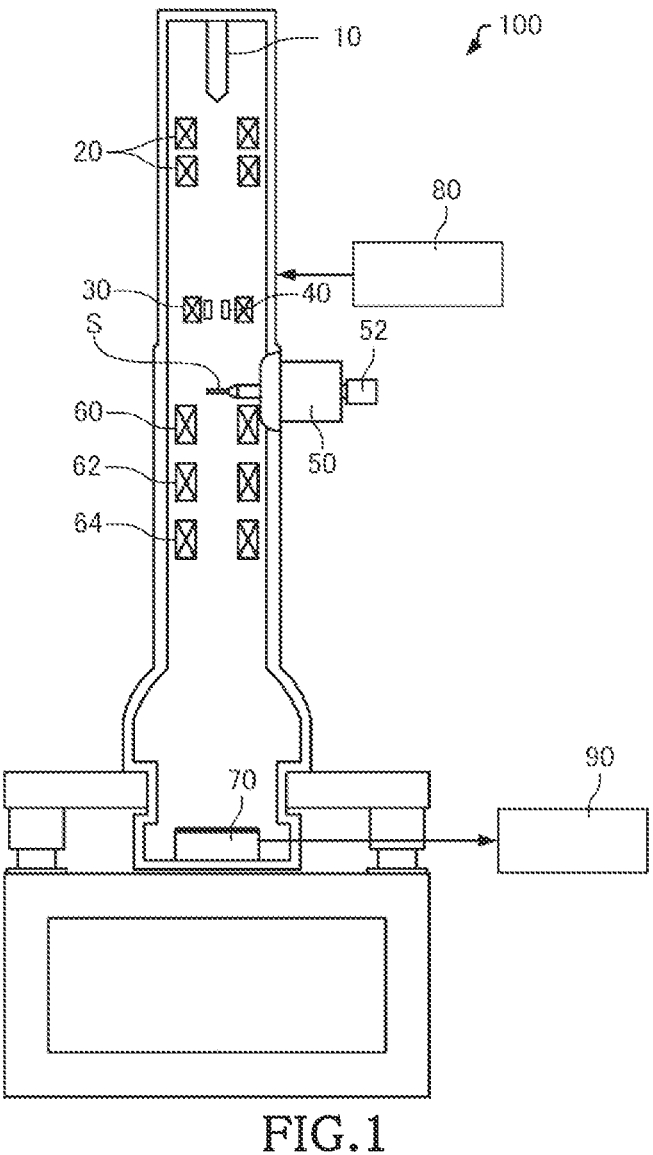
FIG. 1 is a schematic diagram showing the configuration of an electron microscope associated with one embodiment of the present invention.

An electron microscope associated with one embodiment of the present invention is first described by referring to FIG. 1, which shows the configuration of this electron microscope, 100. The electron microscope 100 is a scanning transmission electron microscope (STEM) for scanning a sample S with an electron beam and obtaining an STEM image. As shown, the electron microscope 100 includes an electron beam source 10, an illumination lens system 20, a magnetic deflector 30, an electrostatic deflector 40, a sample stage 50, an objective lens 60, an intermediate lens 62, a projector lens 64, a detector 70, a controller 80, and an image capture section 90.

The electron beam source 10 emits an electron beam. For example, the electron beam source 10 is an electron gun which emits the electron beam such that electrons released from a cathode are accelerated by an anode.

The electron beam released from the electron beam source 10 is focused into an electron probe by the illumination lens system 20. The objective lens 60 produces a magnetic field in front of the sample S, and this magnetic field serves as a magnetic lens which cooperates with the illumination lens system 20 to form the electron probe.

The magnetic deflector 30 produces a magnetic field to deflect the electron beam in two dimensions. The magnetic deflector 30 includes two coils for deflecting the electron beam along the X axis and two coils for deflecting the electron beam along the Y axis. The X and Y axes are perpendicular to an optical axis and to each other. For example, the magnetic deflector 30 is a two-stage deflection system where an electron beam is deflected by the first stage deflector and then deflected back by the second stage detector.

The electrostatic deflector 40 deflects the electron beam, for example, in one dimension by producing a static electric field, and includes two opposite electrostatic deflecting plates for deflecting the electron beam along the X axis.

In the electron microscope 100, the electron beam is deflected by the magnetic deflector 30 and the electrostatic deflector 40, whereby the sample S can be scanned with the electron beam, or electron probe.

The sample stage 50 mechanically supports the sample S held in a sample holder 52 and makes it possible to place the sample S in position. The objective lens 60, intermediate lens 62, and projector lens 64 together constitute an imaging lens system by which the electron beam transmitted through the sample S is directed to the detector 70. For example, the detector 70 may be a dark-field STEM detector having an annular detector that detects electrons inelastically scattered through large angles from the sample S or a bright-field STEM detector for detecting electrons which are transmitted through the sample S and exit in the same direction as the incident electron beam. Furthermore, the electron microscope 100 may be equipped with both a dark-field STEM detector and a bright-field STEM detector.

The electron microscope 100 may be equipped with an X-ray detector (not shown) which detects characteristic X-rays emanating from the sample S in response to illumination of the sample S with an electron beam.

The controller 80 controls the magnetic deflector 30 and the electrostatic deflector 40 by generating and supplying scan signals to the deflectors 30 and 40. More specifically, the scan signals include a horizontal scan signal, a vertical scan signal, and a horizontal shift signal. The controller 80 controls the magnetic deflector 30 by supplying the horizontal scan signal and the vertical scan signal to the magnetic deflector 30. The controller 80 controls the electrostatic deflector 40 by supplying the horizontal shift signal (described later) to the electrostatic deflector 40.

The controller 80 includes a processor (such as a CPU (central processing unit) or a DSP (digital signal processor)) and storage devices (such as a RAM (random access memory) and a ROM (read-only memory)). The controller 80 performs various kinds of calculational operations and control operations by executing programs with the processor, the programs being stored in the storage devices. At least part of the controller 80 may be implemented with a dedicated circuit such as an ASIC (e.g., a gate array).

The image capture section 90 creates an STEM image by imaging a detection signal from the detector 70 in synchronism with the scan signal, the detection signal being an intensity signal indicative of the intensity of the electron beam. The STEM image represents a distribution of signal levels (intensity levels of the electron beam) at individual positions on the sample, the distribution being taken by synchronizing the detection signal and the scan signal. The image capture section 90 includes a processor (such as a CPU or a DSP) and storage devices such as a RAM and a ROM. The image capture section 90 performs various kinds of calculational operations and various kinds of control operations by executing programs stored in the storage devices with the processor. At least a part of the image capture section 90 may be implemented by a dedicated circuit such as an ASIC (e.g., a gate array).

In the electron microscope 100, the electron beam emitted from the electron beam source 10 is focused into an electron probe by the illumination lens system 20. The electron probe is deflected in two dimensions by the magnetic deflector 30 and the electrostatic deflector 40. Consequently, the sample S can be scanned with the electron probe. The electron beam transmitted through the sample S is directed to the detector 70 by the imaging lens system and detected by the detector 70. The image capture section 90 images the detection signal from the detector 70 in synchronism with the scan signal and creates an STEM image. The image capture section 90 may generate an elemental map by imaging the signal from an X-ray detector in synchronism with the scan signal. In this way, the electron microscope 100 can produce STEM images and elemental maps as scanned images.

1.2. Magnetic Deflector and Electrostatic Deflector

In the electron microscope 100, the sample S is scanned with the electron probe by deflecting the electron beam in two dimensions by the magnetic deflector 30 and the electrostatic deflector 40.

The magnetic deflector 30 is easy to handle because it can be driven with relatively low voltages. However, the magnetic deflector 30 has a long nonlinear response time due to its transient response as described later. That is, the magnetic deflector 30 needs a long time to settle down, i.e., has a long settling time.

In contrast, the electrostatic deflector 40 takes a quite short time to settle down. The electrostatic deflector 40 has a much shorter nonlinear response time than that of the magnetic deflector 30 and can deflect an electron beam at a higher speed. The electrostatic deflector 40 can deflect an electron beam in a time as short as, for example, nanoseconds.

Figure 2:
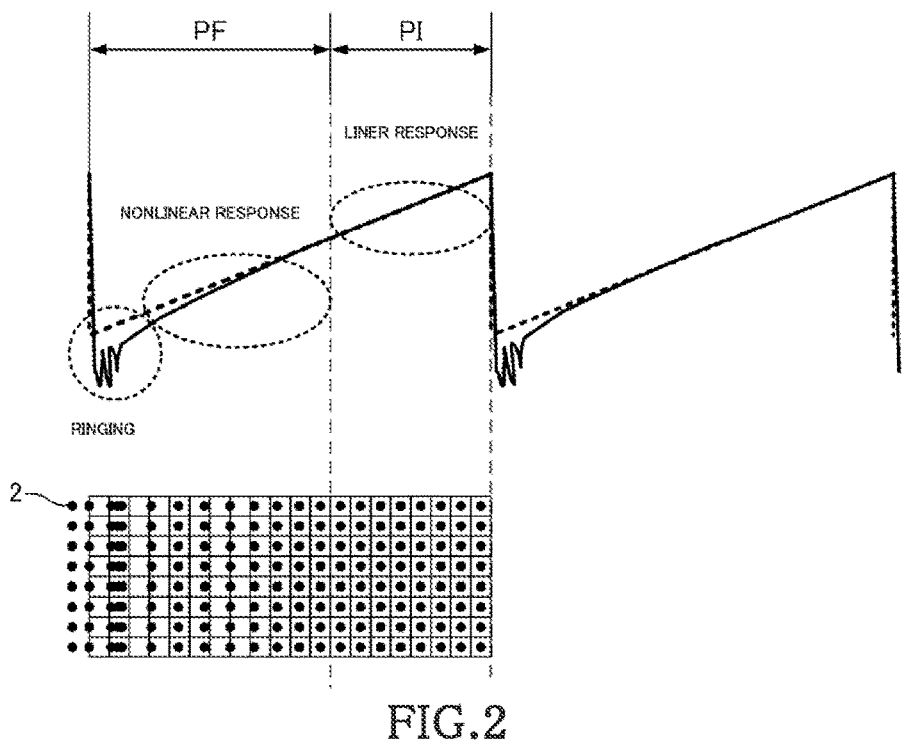
FIG. 2 illustrates the operation of a magnetic deflector.

FIG. 2 illustrates the operation of the magnetic deflector 30. In FIG. 2, the horizontal scan signal is indicated by a broken line. The response of the magnetic deflector 30 is indicated by a solid line. In FIG. 2, each position of beam impingement taken when the magnetic deflector 30 is operated with the horizontal scan signal is indicated by numeral 2.

In the magnetic deflector 30, after flyback of the electron beam, ringing is produced by a transient response and a nonlinear response will result. Therefore, as shown in FIG. 2, during flyback of the electron beam after drawing a scan line horizontally with the electron beam, the horizontal scan signal applied to the magnetic deflector 30 and the magnetic deflector 30 do not respond equally, in which case the scanned image will be distorted or blurred.

Accordingly, while the magnetic deflector 30 is responding nonlinearly, an image is captured after the completion of a linear response. In the example shown in FIG. 2, the wait time until a linear response of the magnetic deflector 30 is referred to as the flyback time PF. After a lapse of the flyback time PF and during a scan line drawing period PI, a scan line is drawn across the sample and an image is captured.

2. Scan Signals

Figure 3:
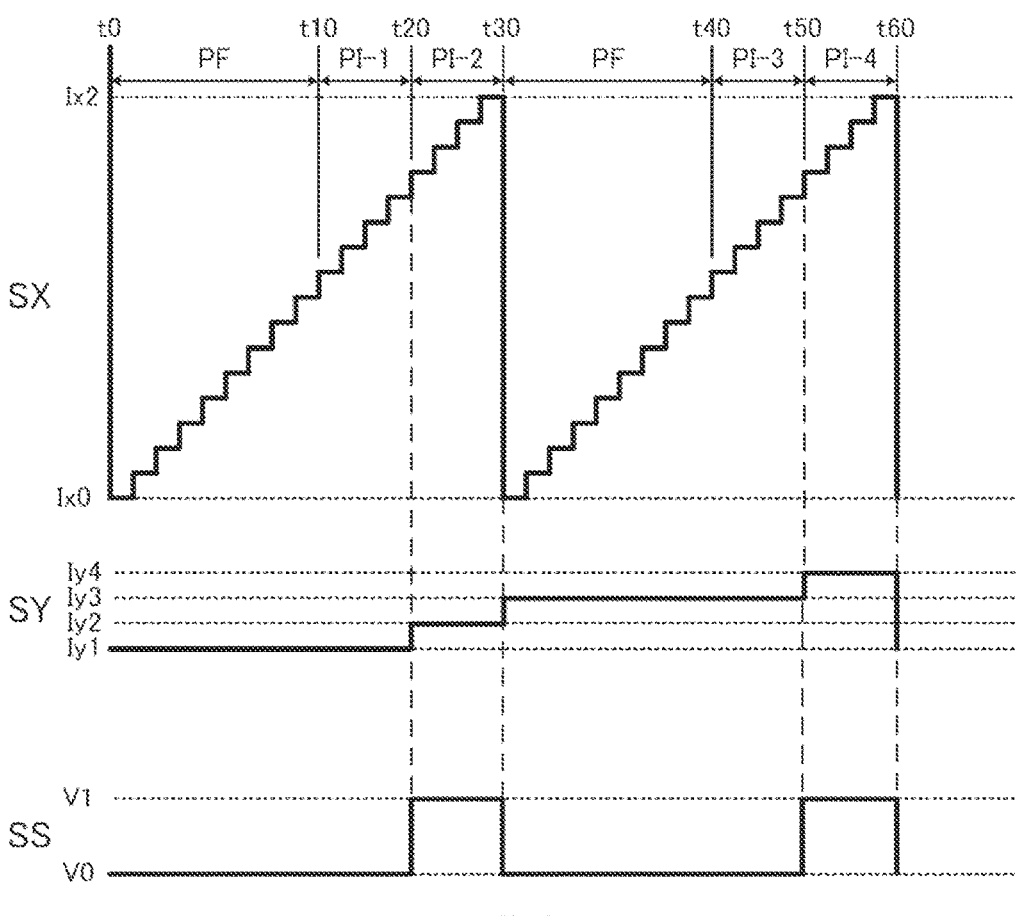
FIG. 3 is a waveform diagram of a horizontal scan signal, a vertical scan signal, and a horizontal shift signal.

Scan signals are next described. The scan signals include a horizontal scan signal, a vertical scan signal, and a horizontal shift signal. FIG. 3 is a waveform diagram of the horizontal scan signal SX, the vertical scan signal SY, and the horizontal shift signal SS.

The sample S has a region S2 (see FIG. 4) to be observed. It is assumed that an STEM image where 4 pixels are arranged horizontally (in the X direction) and 4 pixels are arranged vertically (in the Y direction) in 4 rows and 4 columns is captured from the observed region S2.

The horizontal scan signal SX is supplied to the magnetic deflector 30 to move the electron beam horizontally (in the X direction). The vertical scan signal SY is supplied to the magnetic deflector 30 to move the electron beam vertically (in the Y direction). The horizontal shift signal SS is supplied to the electrostatic deflector 40 to move the electron beam horizontally (in the X direction). These horizontal scan signal SX, vertical scan signal SY, and horizontal shift signal SS are synchronous.

The horizontal scan signal SX is a saw-toothed signal and increases in electrical current in increments from Ix0 to Ix2 for a time interval from instant t0 to instant t30. One increment of the electrical current of the horizontal scan signal SX corresponds to one position of beam impingement, i.e., one pixel of an STEM image. At instant t0, the electrical current value of the vertical scan signal SY is Iy1 and the voltage value of the horizontal shift signal SS is V0.

At instant t20, the electrical current value of the vertical scan signal SY varies from Iy1 to Iy2. Also, at instant t20, the voltage value of the horizontal shift signal SS varies from V0 to V1.

At instant t30, the horizontal scan signal SX varies in electrical current value from Ix2 to Ix0. Also, at instant t30, the vertical scan signal SY varies in electrical current value from Iy2 to Iy3. Furthermore, at instant t30, the horizontal shift signal SS changes in voltage value from V1 to V0.

The horizontal scan signal SX increases in electrical current value in increments from Ix0 to Ix2 for a time interval from instant t30 to instant t60.

At instant t50, the vertical scan signal SY varies in electrical current value from Iy3 to Iy4. Also, at instant t50, the horizontal shift signal SS varies in voltage value from V0 to V1.

At instant t60, the horizontal scan signal SX varies in electrical current value from Ix2 to Ix0. Also, at instant t60, the vertical scan signal SY varies in electrical current value from Iy4 to Iy0. Furthermore, at instant t60, the horizontal shift signal SS varies in voltage value from V1 to V0.

The image capture section 90 performs image capture during a first scan line drawing period PI-1 from instant t10 to instant t20, during a second scan line drawing period PI-2 from instant t20 to instant t30, during a third scan line drawing period PI-3 from instant t40 to instant t50, and during a fourth scan line drawing period PI-4 from instant t50 to instant t60. That is, the image capture section 90 does not effect image capture during a flyback time PF from instant t0 to instant t10 and during a flyback time PF from instant t30 to instant t40. In the illustrated example, there are two scan line drawing periods within one cycle of the horizontal scan signal SX, and two scan lines are drawn within one cycle.

The flyback time PF is a wait time from when a scan line is drawn to when the electron beam is deflected back and a next scan line is drawn. The flyback time PF is set longer than the time of the nonlinear response caused by a transient response of the magnetic deflector 30.

3. Operation of Electron Microscope

FIGS. 4-11 schematically illustrate the operation of the electron microscope 100 when the horizontal scan signal SX and the vertical scan signal SY shown in FIG. 3 are supplied to the magnetic deflector 30 and the horizontal shift signal SS shown in FIG. 3 is supplied to the electrostatic deflector 40.

Figure 4:
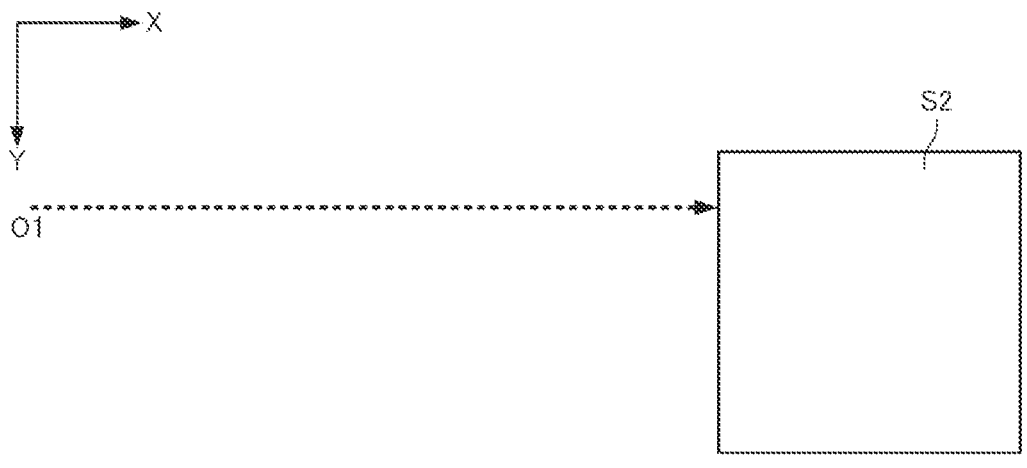
FIGS. 4-11 are schematic diagrams illustrating the operation of an electron microscope.

As shown in FIG. 4, at instant t0, the electron beam is placed at a scanning start position O1 that lies on the sample S and outside the observed region S2. During the flyback time PF from instant t0 to instant t10, the horizontal scan signal SX increases incrementally in electrical current value. Therefore, in the flyback time PF from instant t0 to instant t10, the electron beam is deflected by the magnetic deflector 30 and moved in the +X direction on the sample S and outside the observed region S2. During the flyback time PF, image capture is not effected.

Figure 5:
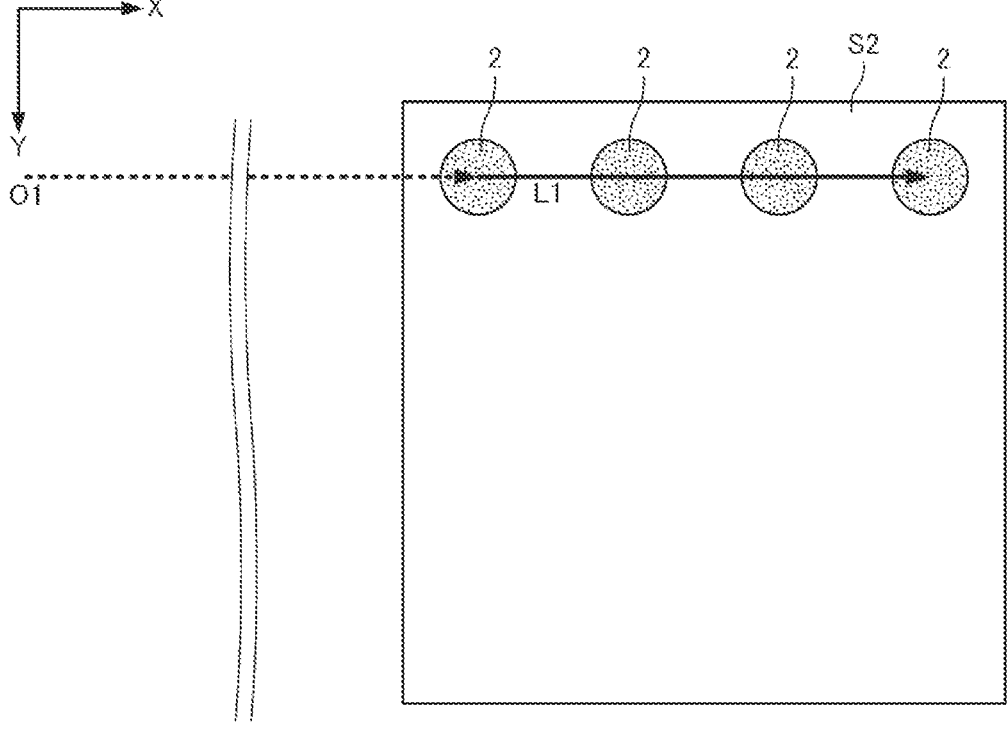

At instant t10 after a lapse of the flyback time PF from instant t0, image capture is initiated. During the first scan line drawing period PI-1 from instant t10 to t20, the horizontal scan signal SX rises in level in increments. Therefore, as shown in FIG. 5, the electron beam is deflected by the magnetic deflector 30. The electron beam is moved in the +X direction on the sample S, and the first scan line L1 is drawn, during which image capture is performed. That is, at each position 2 of beam impingement on the first scan line L1, the electron beam transmitted through the sample S is detected by the detector 70, and the image capture section 90 acquires information about the signal intensity at each position 2 of beam impingement in synchronization with the scan signal.

Figure 6:
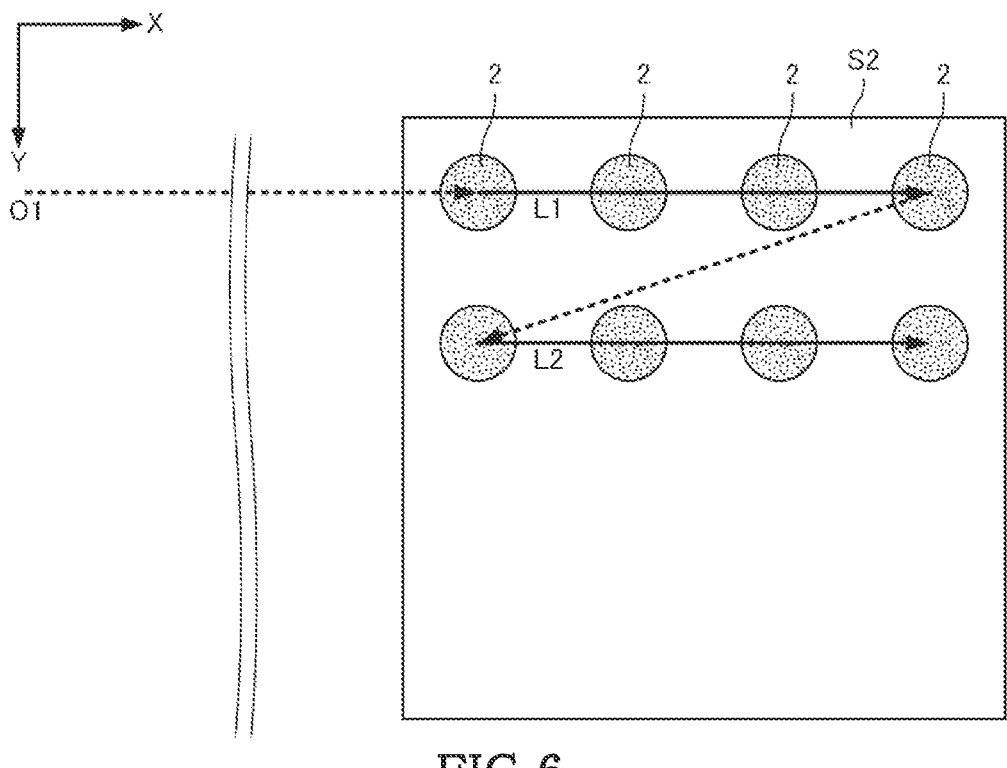

At instant t20, the vertical scan signal SY varies in electrical current value from Iy1 to Iy2. Consequently, as shown in FIG. 6, the electron beam is deflected by the magnetic deflector 30, so that the electron beam steps a distance of one pixel in the +Y direction on the sample S.

Also, at instant t20, the horizontal shift signal SS varies in voltage value from V0 to V1. In consequence, the electron beam is deflected by the electrostatic deflector 40, and the beam is deflected backwards a distance equal to the length of the first scan line L1 on the sample S.

Figure 7:
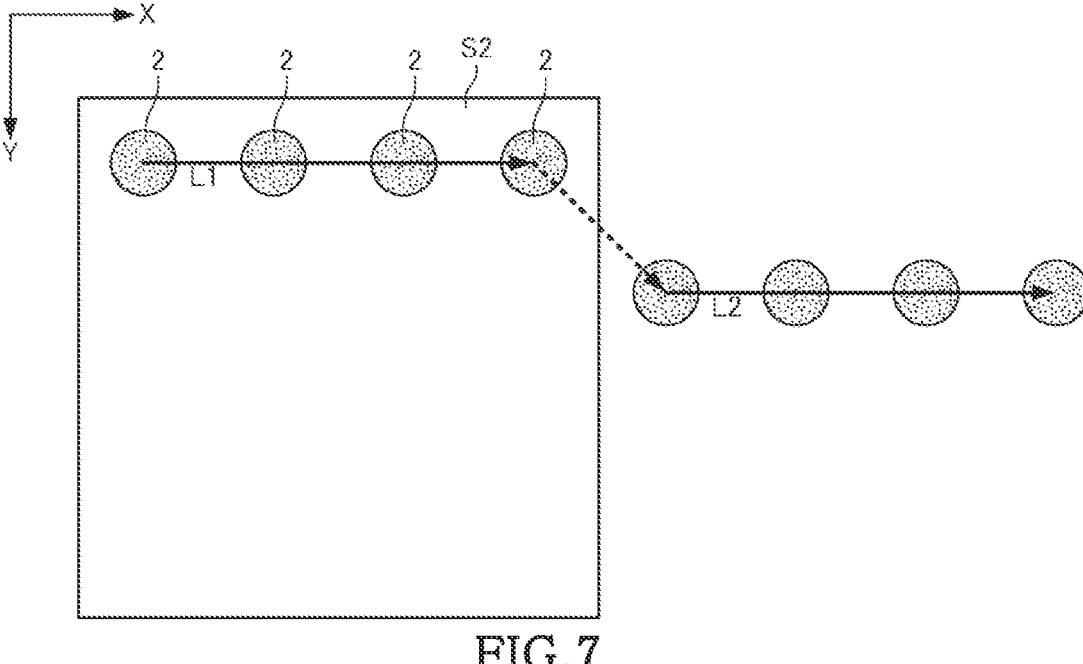

If the horizontal shift signal SS does not vary in voltage value at the instant t20, then the second scan line L2 will be drawn outside the observed region S2 as shown in FIG. 7. At instant t20, the electron beam is deflected back by the electrostatic deflector 40, so that the electron beam moves a distance equal to the length of the first scan line L1 in the –X direction on the sample S as shown in FIG. 6. As a result, the beam moves from the end point of the first scan line L1 to the starting point of the second scan line L2. The starting point of the second scan line L2 agrees in X coordinate with the starting point of the first scan line L11. The second scan line L2 is coincident in length with the first scan line L1.

At instant t20, the electron beam is deflected back with the electrostatic deflector 40. This makes it unnecessary to establish the flyback time PF from when the first scan line L1 is drawn to when the second scan line L2 is drawn.

During the second scan line drawing period PI-2 from instant t20 to instant t30, the horizontal scan signal SX increases in level in increments. Therefore, as shown in FIG. 6, the electron beam is deflected by the magnetic deflector 30. The beam moves in the +X direction on the sample S and the second scan line L2 is drawn, during which image capture is done.

At instant t30, the horizontal scan signal SX varies in electrical current value from Ix2 to Ix0. At this time, the horizontal shift signal SS varies in voltage value from V1 to V0. Consequently, the electron beam is deflected by the magnetic deflector 30 and the electrostatic deflector 40. The beam is deflected backwards a distance equal to the sum of the amount of movement of the electron beam during the flyback time PF and the length of the second scan line L2 and moves in the –X direction.

Also, at instant t30, the vertical scan signal SY varies in electrical current value from Iy2 to Iy3. Consequently, the electron beam is deflected by the magnetic deflector 30. The electron beam is moved a distance of one pixel on the sample S in the +Y direction.

Figure 8:
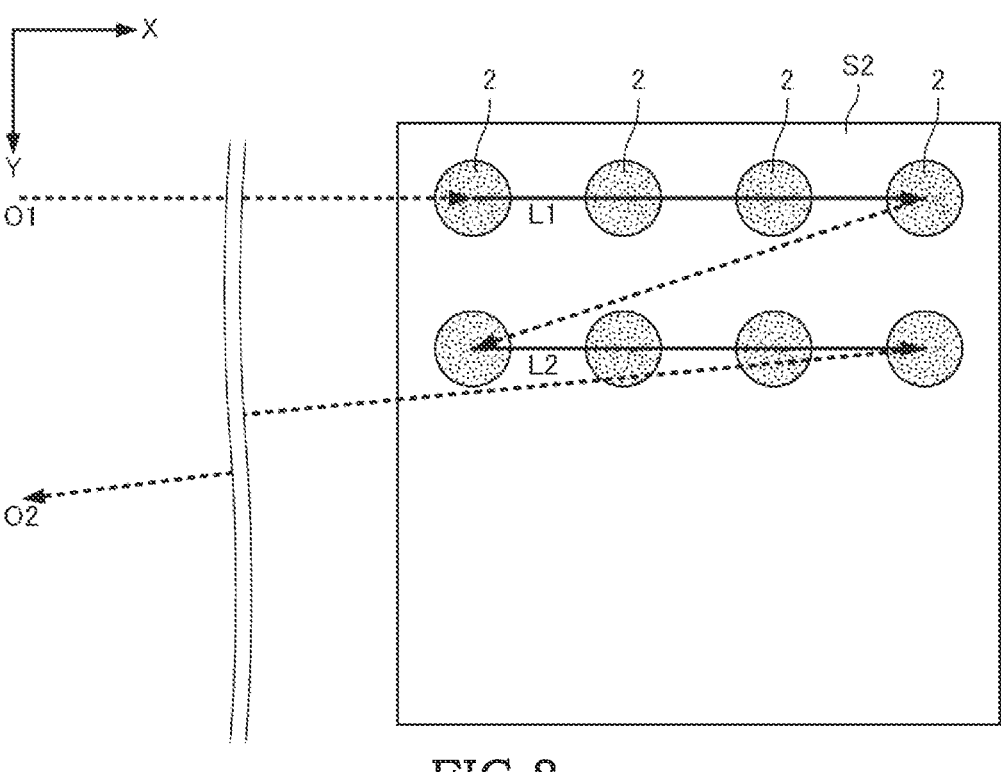

As a result, as shown in FIG. 8, at instant t30, the electron beam moves from the end point of the second scan line L2 to a scanning starting point O2 that lies outside the observed region S2. The scanning starting position O2 agrees in X coordinate with the scanning starting position O1. The scanning starting position O2 agrees in Y coordinate with a third scan line L3. The third scan line L3 agrees in length with the second scan line L2.

Figure 9:
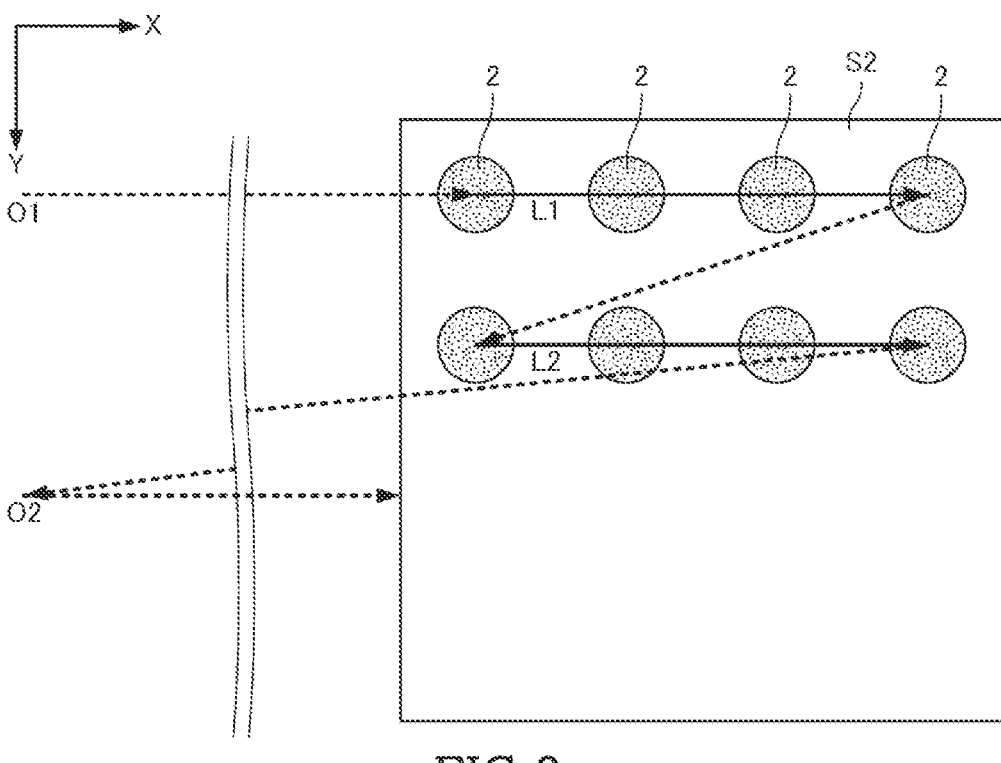

At instant t30, the electron beam lies at the scanning starting position O2 which is on the sample S and outside the observed region S2. During the flyback time PF from instant t30 to instant t40, the horizontal scan signal SX rises in electrical current value in increments. Therefore, as shown in FIG. 9, during the flyback time PF from instant t30 to instant t40, the electron beam is deflected by the magnetic deflector 30 and moves in the +X direction on the sample S and outside the observed region S2. During this flyback time PF, image capture is not effected.

Figure 10:
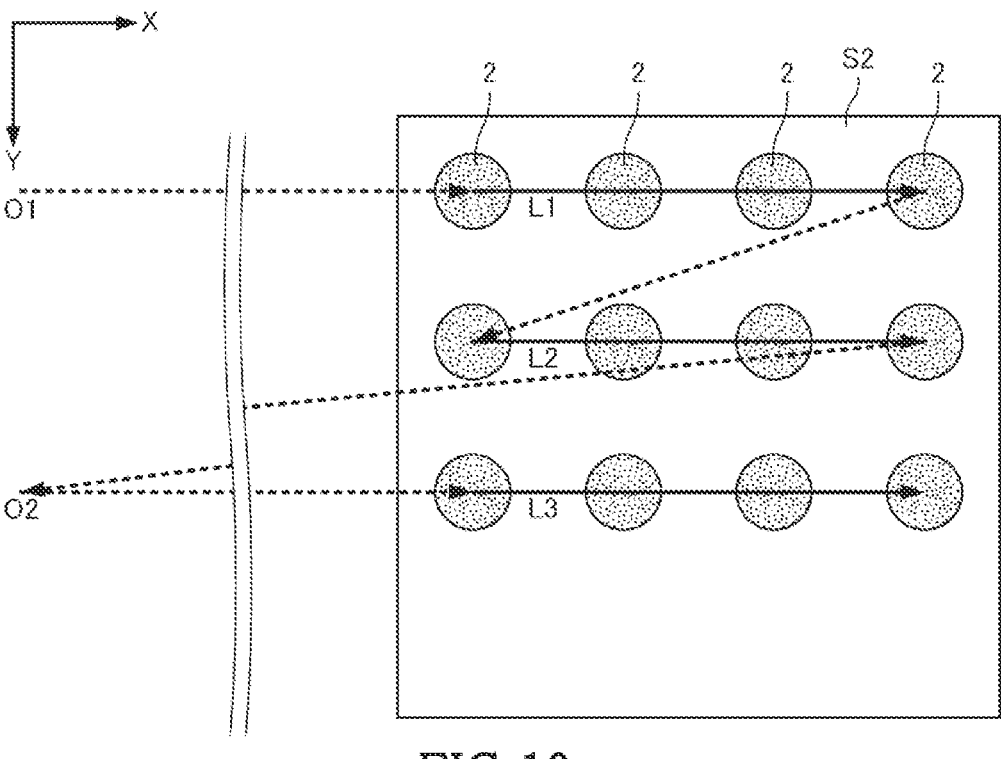

At instant t40 after a lapse of the flyback time PF from instant t30, image capture is restarted. During the third scan line drawing period PI-3 from instant t40 to instant t50, the horizontal scan signal SX increases in level in increments. Therefore, as shown in FIG. 10, the electron beam is deflected by the magnetic deflector 30 and moves in the +X direction on the sample S and the third scan line L3 is drawn, during which image capture is effected.

Figure 11:
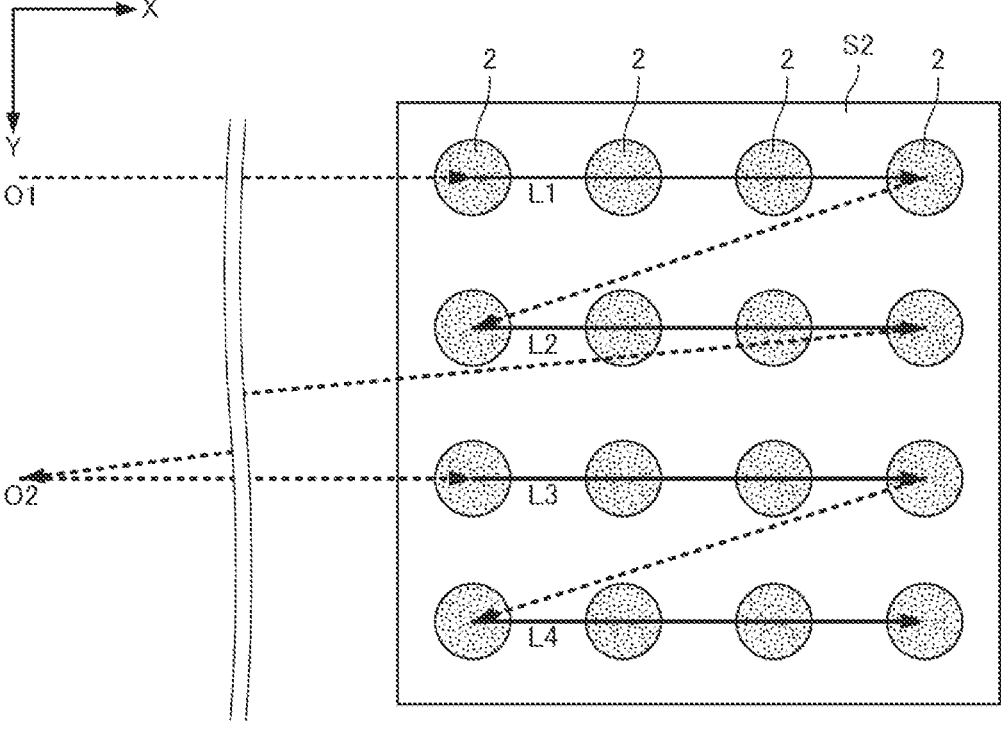

At instant t50, the vertical scan signal SY varies in electrical current value from Iy3 to Iy4. Consequently, as shown in FIG. 11, the electron beam is deflected by the magnetic deflector 30, so that the beam moves a distance of one pixel in the +Y direction on the sample S. Also, at instant t50, the horizontal shift signal SS varies in voltage value from V0 to V1. As a result, the electron beam is deflected by the electrostatic deflector 40 and deflected backwards a distance equal to the length of the third scan line L3 on the sample S.

The electron beam moves a distance equal to the length of the third scan line L3 in the –X direction on the sample S as shown in FIG. 11, so that the beam moves from the end point of the third scan line L3 to the starting point of a fourth scan line L4 whose X coordinate agrees with that of the starting point of the third scan line L3. The fourth scan line L4 is equal in length to the third scan line L3.

At instant t50, the electron beam is deflected back by the electrostatic deflector 40. As a result, it is not necessary to establish the flyback period PF between when the third scan line L3 is drawn and when the fourth scan line L4 is drawn.

During the fourth scan line drawing period PI-4 from instant t50 to instant t60, the horizontal scan signal SX increases in level in increments. Therefore, as shown in FIG. 11, the electron beam is deflected by the magnetic deflector 30 and moves in the +X direction on the sample S. The fourth scan line L4 is drawn, during which image capture is effected.

Because of the processing steps described thus far, one frame of image is captured. In the electron microscope 100, these steps are repeated so that plural frames of image are accumulated. Thus, an STEM image can be obtained.

In the foregoing description, an STEM image consisting of 4 pixels×4 pixels is derived. Note that no restriction is imposed on the number of pixels of the STEM image. An STEM image can be obtained by a technique similar to the technique of the foregoing embodiment if the number of pixels of the STEM image is different from that of the foregoing embodiment.

4. Advantageous Effects

The electron microscope 100 includes the magnetic deflector 30 for producing a magnetic field to deflect an electron beam, the electrostatic deflector 40 for producing an electric field to deflect the electron beam, and the controller 80 for controlling both magnetic deflector 30 and electrostatic deflector 40. The controller 80 causes the magnetic deflector 30 to deflect the electron beam in the +X direction and to draw the first scan line L1. The controller 80 also causes the magnetic deflector 30 to deflect the electron beam in the +Y direction perpendicular to the +X direction. The controller 80 causes the electrostatic deflector 40 to deflect the electron beam in the –X direction opposite to the +X direction and causes the magnetic deflector 30 to deflect the electron beam in the +X direction and to draw the second scan line L2.

In this way, in the electron microscope 100, after the first scan line L1 is drawn with the magnetic deflector 30, the beam is deflected back by the electrostatic deflector 40, and the second scan line L2 is drawn with the magnetic deflector 30. Therefore, the flyback time can be shortened as compared to the case where the electron beam is deflected back by the magnetic deflector 30. Consequently, in the electron microscope 100, the sample S can be scanned in a shorter time.

For example, where an STEM image is generated by accumulating plural frames of image, it is desirable to set the frame rate (i.e., the number of frames per unit time) to a higher value. If the frame rate is increased, i.e., if the speed at which the electron beam is scanned is increased, the dwell time of the electron beam on each pixel of the STEM image can be shortened and thus the amount of electron beam impinging at each position of beam impingement 2 in one irradiation operation can be reduced. In consequence, electron beam damage to the sample can be reduced. Hence, a good STEM image can be obtained.

Figure 12:
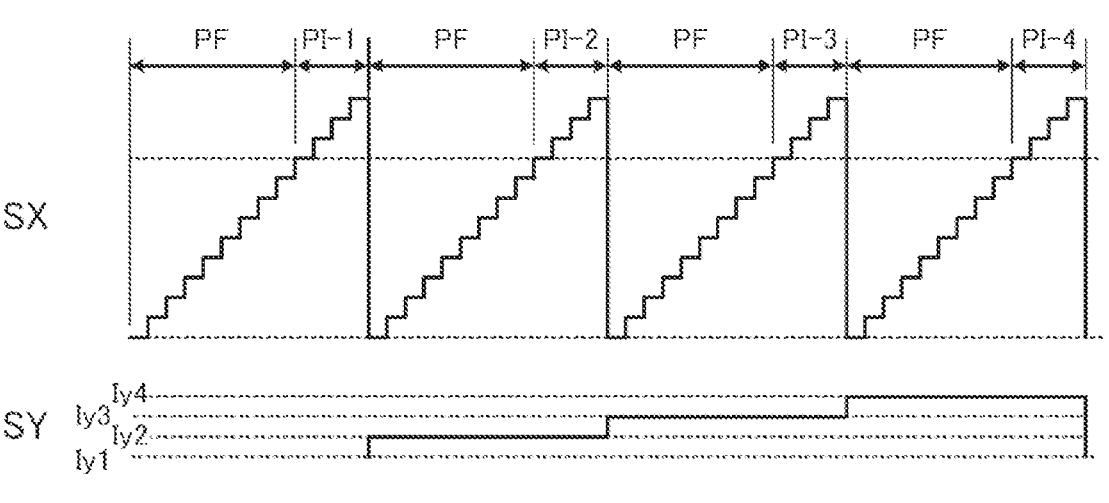
FIG. 12 is a waveform diagram of the horizontal scan signal and the vertical scan signal.

FIG. 12 is a waveform diagram of the horizontal scan signal SX and the vertical scan signal SY used when an electron beam is deflected by the magnetic deflector 30 without using the electrostatic deflector 40.

In the example shown in FIG. 12, after drawing the first scan line L1, the electron beam is deflected back with the magnetic deflector 30 and the second scan line L2 is drawn. Therefore, a flyback time PF is needed between when the first scan line L1 is drawn and when second scan line L2 is drawn.

In contrast, in the electron microscope 100, the second scan line L2 is drawn with the magnetic deflector 30 after drawing the first scan line L1 with the magnetic deflector 30 and deflecting back the electron beam with the electrostatic deflector 40. Therefore, it is not necessary to provide the flyback time PF. For example, in the example shown in FIG. 12, four flyback times must be provided per frame. In the electron microscope 100 shown in FIG. 3, two flyback times PF suffice per frame.

In the example shown in FIG. 12, a horizontal scan time can be found by multiplying the electron beam dwell time per pixel by the number of pixels in the horizontal direction and adding the flyback time PF. The time taken by one frame of image (i.e., one scanning step) is found by multiplying the horizontal scan time by the number of pixels in the vertical direction. Since the flyback time PF is constant irrespective of electron beam speed, as the frame rate is increased, the ratio of the flyback time PF to the image capture time taken to obtain an accumulated image will increase.

In the electron microscope 100, the number of flyback times PF per frame can be reduced as described above and so, if the frame rate is increased, the ratio of the total flyback time to the image capture time will increase at a lower rate than in the example of FIG. 12.

In the electron microscope 100, the controller 80 causes the electrostatic deflector 40 to deflect the electron beam a distance equal to the length of the first scan line L1 in the —X direction. This can bring the starting point of the second scan line L2 and the starting point of the first scan line L1 into coincidence in X coordinate.

In the electron microscope 100, after drawing the second scan line L2, the controller 80 causes the magnetic deflector 30 to deflect the electron beam in the +Y direction perpendicular to the +X direction and then in the −X direction. The controller 80 then causes the magnetic deflector 30 to deflect the beam in the +X direction and to draw the third scan line L3. Therefore, in the electron microscope 100, it is not necessary to deflect the electron beam a great amount by the electrostatic deflector 40. Consequently, in the electron microscope 100, it is not needed to apply a high voltage to the electrostatic deflector 40.

Figure 13:
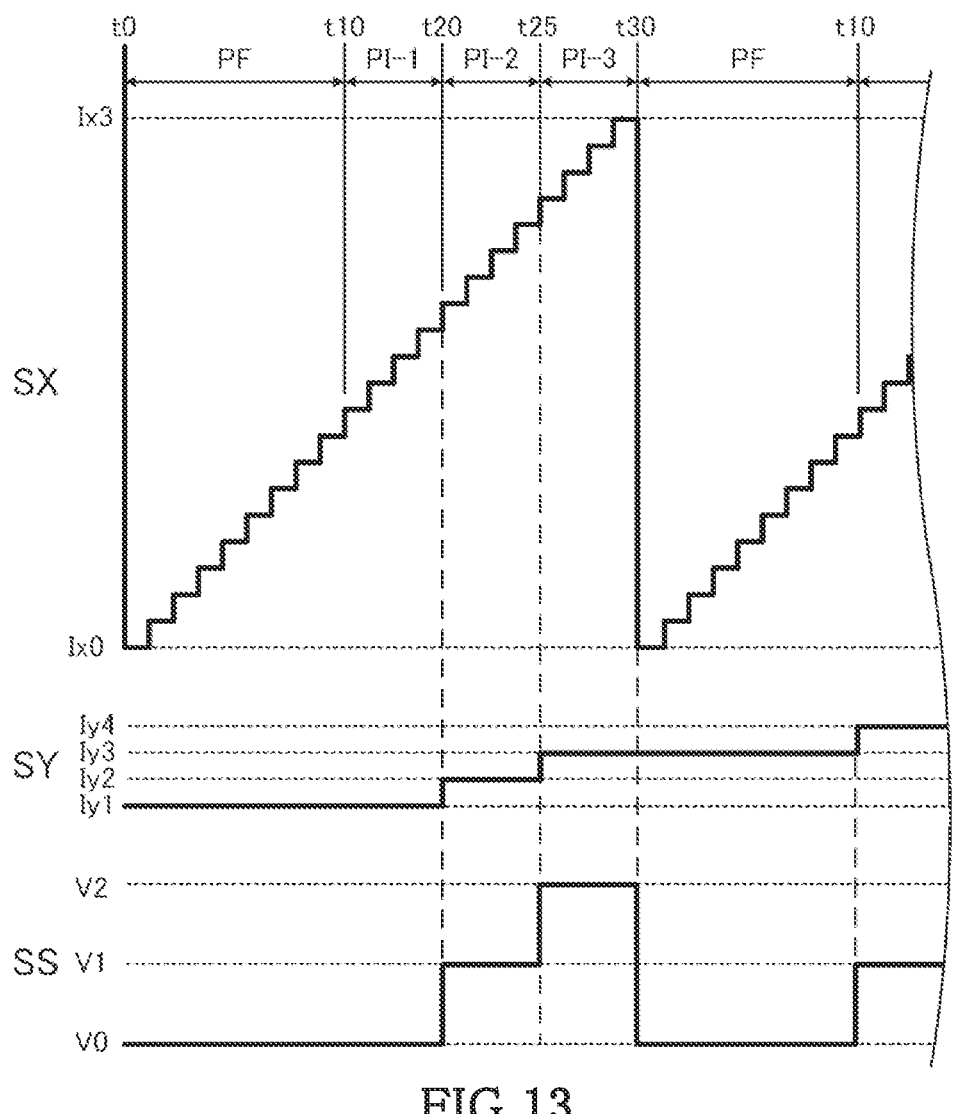
FIG. 13 is a waveform diagram of the horizontal scan signal, the vertical scan signal, and the horizontal shift signal.
Figure 14:
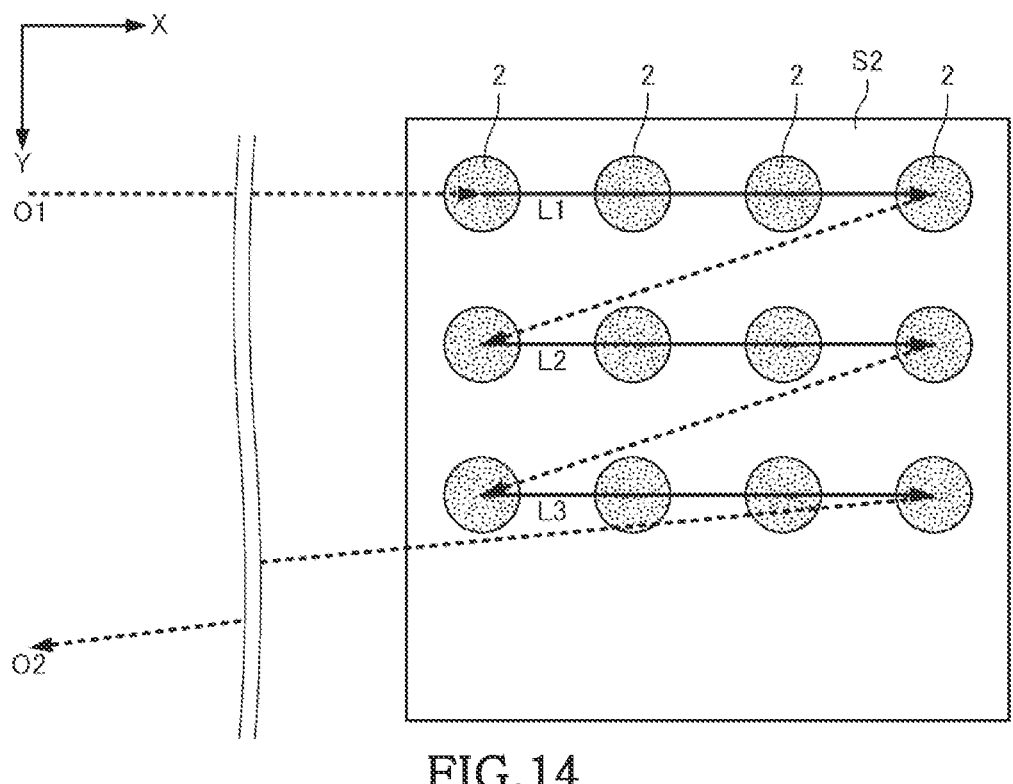
FIG. 14 is a schematic diagram illustrating the operation of an electron microscope.

FIG. 13 is a waveform diagram of the horizontal scan signal SX, vertical scan signal SY, and horizontal shift signal SS which are used together when the electron beam is deflected in the −X direction by the electrostatic deflector 40 after drawing the second scan signal L2. FIG. 14 illustrates the operation of the electron microscope 100 when the horizontal scan signal SX and vertical scan signal SY of FIG. 13 are supplied to the magnetic deflector 30, and the horizontal shift signal SS is supplied to the electrostatic deflector 40.

When the electron beam is deflected in the −X direction with the electrostatic deflector 40 after drawing the second scan line L2 as shown in FIG. 13, the horizontal shift signal SS varies in voltage value from V1 to V2 at instant t25 after a lapse of the second scan line drawing period PI-2 since instant t20. Consequently, as shown in FIG. 14, the electron beam is deflected with the electrostatic deflector 40, and the beam is deflected backwards a distance equal to the length of the second scan line L2 on the sample S. As a result, the electron beam can be shifted from the end point of the second scan line L2 to the starting point of the third scan line L3. During the third scan line drawing period PI-3 from instant t25 to instant t30, the third scan line L3 can be drawn.

In this way, in the example shown in FIG. 13, a voltage V2 greater than the voltage V1 must be impressed on the electrostatic deflector 40. Accordingly, in the example of FIG. 13, the voltage applied to the electrostatic deflector 40 is greater than in the example of FIG. 3.

5. Modifications

5.1. First Modification

Figure 15:
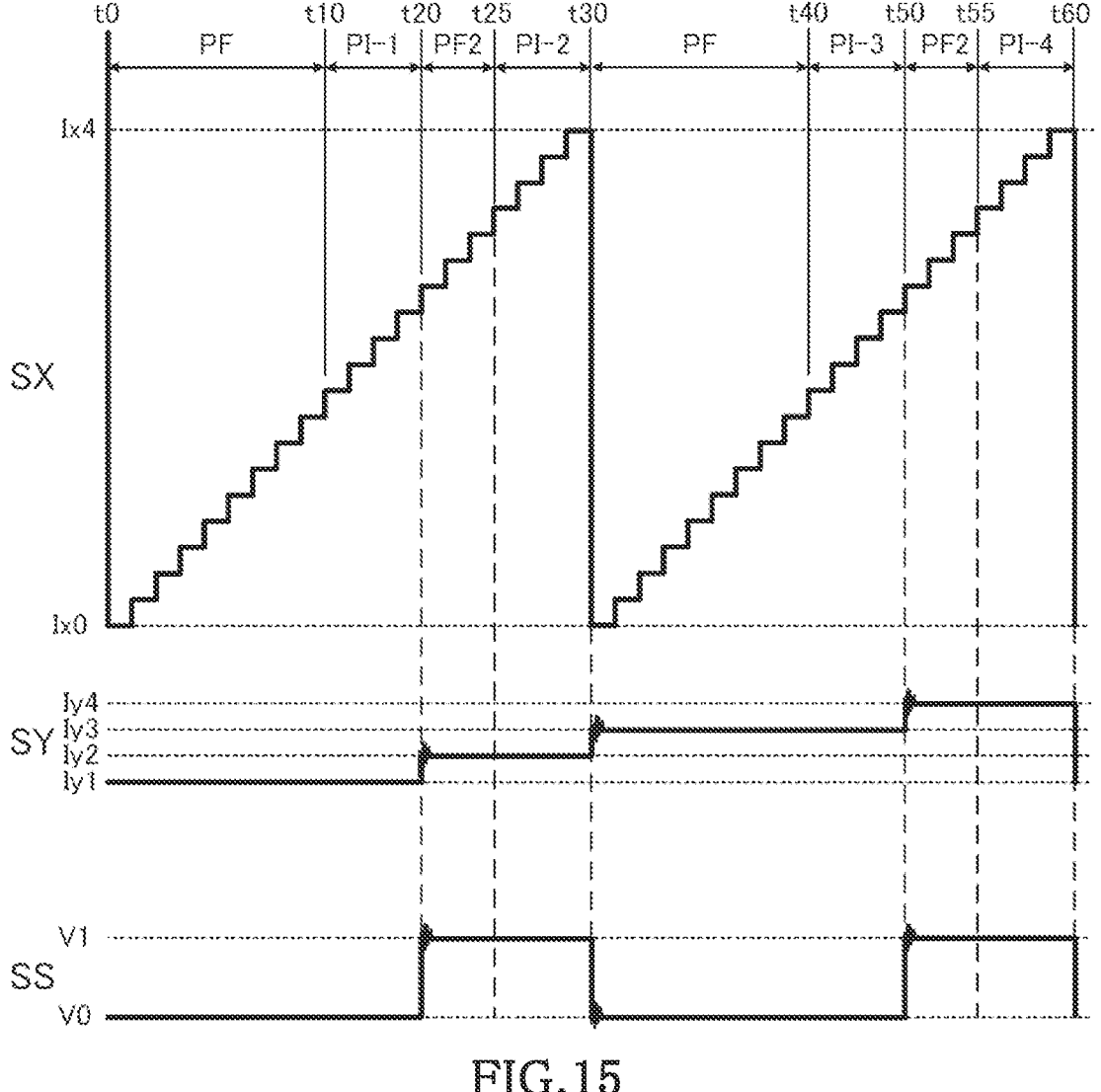
FIG. 15 is a further waveform diagram of the horizontal scan signal, vertical scan signal, and horizontal shift signal.
Figure 16:
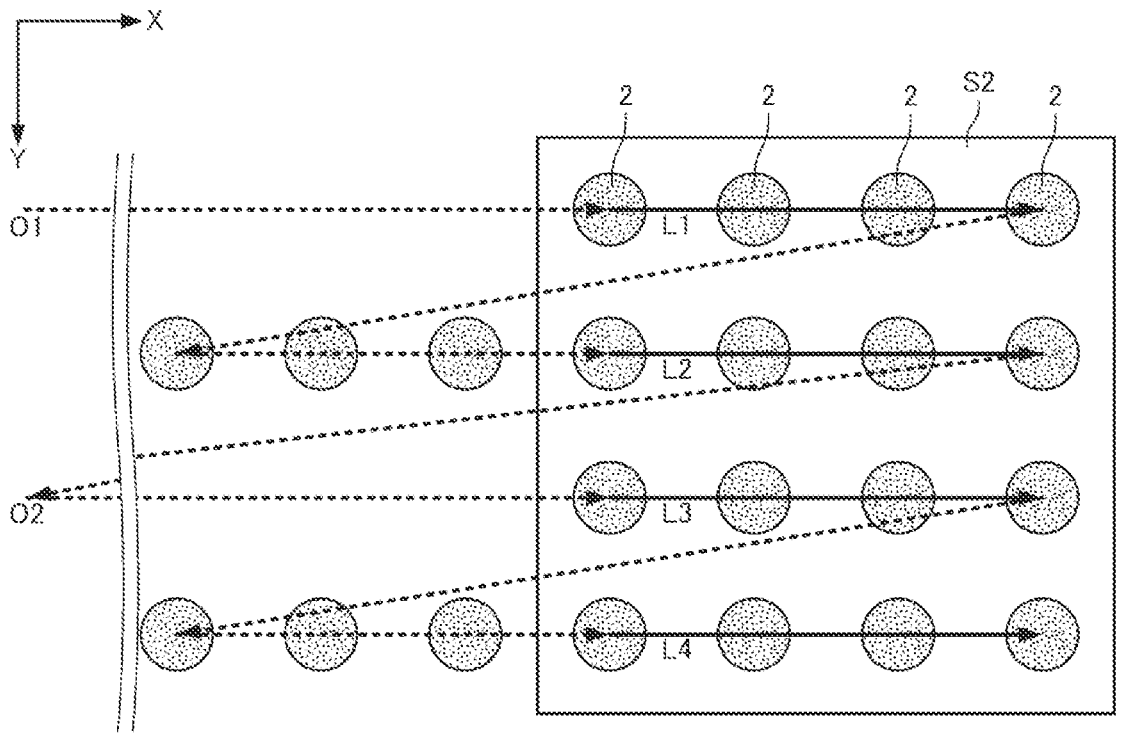
FIG. 16 is a schematic diagram illustrating the operation of an electron microscope.

FIG. 15 is a further waveform diagram of the horizontal signal SX, vertical scan signal SY, and horizontal shift signal SS. FIG. 16 typically illustrates the operation of the electron microscope 100 when the horizontal scan signal SX and vertical scan signal SY of FIG. 15 are supplied to the magnetic deflector 30 and the horizontal shift signal SS of FIG. 15 is supplied to the electrostatic deflector 40. In the following description, only differences with the foregoing embodiment are set forth; a description of similarities is omitted.

In the above-stated embodiment, the second scan line L2 is started to be drawn after the electron beam is deflected back by the electrostatic deflector 40 at instant t20. Alternatively, after the electron beam is deflected back with the electrostatic deflector 40 at instant t20, the second scan line L2 may be started to be drawn after a lapse of a settling time PF2 until the electrostatic deflector 40 settles down.

At step t20, the vertical scan signal SY varies in electrical current value from Iy1 to Iy2. At this time, the magnetic deflector 30 provides a nonlinear response due to its transient response. Also, at instant t20, the horizontal shift signal SS varies in voltage value from V0 to V1. At this time, the electrostatic deflector 40 responds nonlinearly due to its transient response. Therefore, the period from instant t20 to instant t25 is set as the settling time PF2 during which image capture is not effected.

It is assumed herein that during the settling time PF2, a scan line having a length of 3 pixels is drawn by the electron beam. Therefore, as shown in FIG. 16, at instant t20, the controller 80 causes the electrostatic deflector 40 to deflect the electron beam a distance greater than the length of the first scan line L1. In the example of FIGS. 15 and 16, the controller 80 causes the electrostatic deflector 40 to deflect the electron beam a distance equal to the sum of the length of the first scan line L1 and the length of a scan line of 3 pixels. Consequently, the electron beam moves a distance on the sample S in the –X direction, the distance being equal to the sum of the length of the first scan line L1 and the length of the scan line of 3 pixels.

There is no restriction on the settling time PF2 which may be either a time taken to draw a scan line of a length equal to or greater than 4 pixels or a time taken to draw a scan line of a length equal to or less than 3 pixels.

At instant t25 after a lapse of the settling time PF2, the third scan line L3 is started to be drawn and image capture is initiated.

At instant t50, the vertical scan signal SY varies in electrical current value from Iy3 to Iy4. Also, at instant t50, the horizontal shift signal SS varies in voltage value from V0 to V1. The period from instant t50 to instant t55 is set as the settling time PF2 that persists until the electrostatic deflector 40 provides linear response. During the settling time PF2, image capture is not effected.

It is assumed herein that the settling time PF2 stipulates the time taken by an electron beam to draw a scan line of a length of 3 pixels. Therefore, as shown in FIG. 16, at instant t50, the controller 80 causes the electrostatic deflector 40 to deflect the electron beam a distance greater than the length of the third scan line L3. In the example of FIGS. 15 and 16, the controller 80 causes the electrostatic deflector 40 to deflect the beam a distance equal to the sum of the length of the third scan line L3 and the length of the scan line of 3 pixels. Consequently, the electron beam moves in the –X direction on the sample S over a distance equal to the sum of the length of the third scan line L3 and the length of the scan line of 3 pixels.

At instant t55 after a lapse of the settling time PF2, the fourth scan line L4 is started to be drawn and image capture is initiated.

In a first modification, at instant t20, the controller 80 causes the electrostatic deflector 40 to deflect the electron beam in the –X direction by a distance greater than the length of the first scan line L1. Therefore, it is possible to establish the settling time PF2 between when the electron beam is deflected back and when the second scan line L2 is drawn. Consequently, the effects of the transient response of the electrostatic deflector 40 can be reduced. As a result, less distorted and less blurred STEM images can be obtained.

5.2. Second Modification

In the foregoing embodiment, as shown in FIGS. 3 and 8, after drawing the first scan line L1, the electron beam is deflected back by the electrostatic deflector 40. After drawing the second scan line L2, the beam is deflected back by the magnetic deflector 30. That is, two scan lines are drawn in one cycle of the horizontal scan signal SX. There are no restrictions on the number of scan lines N drawn in one cycle of the horizontal scan signal SX as long as N is an integer equal to or greater than two.

If the number of scan lines drawn in one cycle of the horizontal scan signal SX is N, one scan line is drawn and then the electron beam is deflected back by the electrostatic deflector 40. This step is repeated until an Nth scan line is drawn. Thereafter, the electron beam is deflected back with the magnetic deflector 30 and an (N+1)th scan line is drawn. For example, in the example of FIGS. 13 and 14, three scan lines are drawn in one cycle of the horizontal scan signal SX. By increasing the number of scan lines N, the number of flyback times PF per frame can be reduced.

After drawing the Nth scan line, the controller 80 causes the magnetic deflector 30 to deflect the electron beam in the +Y direction and causes the magnetic deflector 30 to deflect the beam in the –X direction. Then, the controller causes the magnetic deflector 30 to deflect the beam in the +X direction and to draw the (N+1)th scan line. Accordingly, in the electron microscope 100, it is not needed to deflect the electron beam to a great extent by the electrostatic deflector 40. Hence, it is not necessary to apply a high voltage to the electrostatic deflector 40.

5.3. Third Modification

In the foregoing embodiment, the charged particle beam system associated with the present invention is a scanning transmission electron microscope (STEM) which scans the sample S with an electron beam and acquires an STEM image. The charged particle beam system associated with the present invention may also be an apparatus which scans a sample with a charged particle beam other than an electron beam such as an ion beam and acquires a scanned image. For example, the charged particle beam system associated with the present invention may be a scanning electron microscope (SEM), an electron probe microanalyzer (EPMA), an electron beam lithography system, an Auger microprobe, or a focused ion beam (FIB) system.

Note that the foregoing embodiments and modifications are merely exemplary and that the present invention is not restricted thereto. For example, the embodiments and modifications can be combined appropriately.

It is to be understood that the present invention is not restricted to the foregoing embodiments and that the invention may be practiced in variously modified forms. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A charged particle beam system for scanning a sample with a charged particle beam and obtaining a scanned image, said charged particle beam system comprising:

a magnetic deflector for producing a magnetic field to deflect the charged particle beam;

an electrostatic deflector for producing an electric field to deflect the charged particle beam; and a controller for controlling the magnetic deflector and the electrostatic deflector;

wherein said controller is configured to:

cause the magnetic deflector to deflect the charged particle beam in a first direction and to draw a first scan line, cause the magnetic deflector to deflect the charged particle beam in a second direction perpendicular to the first direction after the first scan line has been drawn, cause the electrostatic deflector to deflect the charged particle beam in a third direction opposite to the first direction after the first scan line has been drawn, and cause the magnetic deflector to deflect the charged particle beam in the first direction and to draw a second scan line after the charged particle beam has been deflected in the second direction and in the third direction.

2. The charged particle beam system as set forth in claim 1, wherein said controller is configured to cause said electrostatic deflector to deflect the charged particle beam in said third direction by a distance equal to a length of said first scan line.

3. The charged particle beam system as set forth in claim 1, wherein said controller is configured to cause said electrostatic deflector to deflect the charged particle beam in said third direction by a distance greater than a length of said first scan line.

4. The charged particle beam system as set forth in claim 1, wherein said controller is configured to:

cause said magnetic deflector to deflect the charged particle beam in said second direction after drawing an Nth scan line, wherein N is an integer equal to or greater than two, cause said magnetic deflector to deflect the charged particle beam in said third direction, and cause the magnetic deflector to deflect the charged particle beam in said first direction and to draw an (N+1)th scan line.

5. The charged particle beam system as set forth in claim 1, wherein the scanned image is of an observed region of the sample, and wherein said controller is configured to:

before causing the magnetic deflector to deflect the charged particle beam in the first direction and to draw the first scan line, cause the magnetic deflector to deflect the charged particle beam so that the charged particle beam is placed at a scanning start position that lies outside the observed region.

6. The charged particle beam system as set forth in claim 5, wherein after causing the magnetic deflector to deflect the charged particle beam so that the charged particle beam is placed at the scanning start position that lies outside the observed region, during a lapse of a flyback time, when ringing and a nonlinear response of the magnetic deflector occur, image capture is not effected, and wherein, after said lapse of the flyback time, said controller is configured to cause the magnetic deflector to deflect the charged particle beam in the first direction and to draw the first scan line across the observed region to capture an image.

7. The charged particle beam system as set forth in claim 6, wherein said controller is configured to cause the magnetic deflector to deflect the charged particle beam in the first direction and to draw the second scan line without establishing the flyback time from when the first scan line is drawn to when the second scan line is drawn.

8. A control method for a charged particle beam system comprising a magnetic deflector for producing a magnetic field to deflect a charged particle beam and an electrostatic deflector for producing an electric field to deflect the charged particle beam, the charged particle beam system operating to scan a sample with the charged particle beam and to obtain a scanned image, said control method comprising the steps of:

causing the magnetic deflector to deflect the charged particle beam in a first direction and to draw a first scan line;

causing the magnetic deflector to deflect the charged particle beam in a second direction perpendicular to the first direction after the first scan line has been drawn;

causing the electrostatic deflector to deflect the charged particle beam in a third direction opposite to the first direction after the first scan line has been drawn; and causing the magnetic deflector to deflect the charged particle beam in the first direction and to draw a second scan line after the charged particle beam has been deflected in the second direction and the third direction.

9. The control method as set forth in claim 8, wherein the scanned image is of an observed region of the sample, and wherein said control method further comprises the step of:

before causing the magnetic deflector to deflect the charged particle beam in the first direction and to draw the first scan line, cause the magnetic deflector to deflect the charged particle beam so that the charged particle beam is placed at a scanning start position that lies outside the observed region.

10. The control method as set forth in claim 9, wherein after causing the magnetic deflector to deflect the charged particle beam so that the charged particle beam is placed at the scanning start position that lies outside the observed region, during a lapse of a flyback time, when ringing and a nonlinear response of the magnetic deflector occur, image capture is not effected, and wherein, after said lapse of the flyback time, the magnetic deflector is caused to deflect the charged particle beam in the first direction and to draw the first scan line across the observed region to capture an image.

* * * * *